(12) United States Patent
Le et al.

(10) Patent No.: US 8,967,453 B2
(45) Date of Patent: Mar. 3, 2015

(54) METHODS OF BONDING COMPONENTS FOR FABRICATING ELECTRONIC ASSEMBLIES AND ELECTRONIC ASSEMBLIES INCLUDING BONDED COMPONENTS

(75) Inventors: Khiet Le, Mission Viejo, CA (US); Vicentiu Grosu, San Pedro, CA (US); Gregory S. Smith, Woodland Hills, CA (US); Yunqi Zheng, Racho Palos Verdes, CA (US); Gregory D. Rosdahl, Dominguez Hills, CA (US)

(73) Assignee: GM Global Technology Operations LLC, Detroit, MI (US)

( * ) Notice: Subject to any disclaimer, the term of this patent is extended or adjusted under 35 U.S.C. 154(b) by 278 days.

(21) Appl. No.: 13/426,051

(22) Filed: Mar. 21, 2012

(65) Prior Publication Data
US 2013/0250538 A1   Sep. 26, 2013

(51) Int. Cl.
*B23K 31/02*   (2006.01)

(52) U.S. Cl.
USPC .................. 228/234.3; 228/245; 228/248.1

(58) Field of Classification Search
None
See application file for complete search history.

(56) References Cited

U.S. PATENT DOCUMENTS

| | | | | |
|---|---|---|---|---|
| 3,899,306 | A * | 8/1975 | Knopp et al. | 428/652 |
| 4,965,044 | A * | 10/1990 | Miyamoto et al. | 419/12 |
| 6,736,942 | B2 | 5/2004 | Weihs et al. | |
| 2001/0046597 | A1 * | 11/2001 | Weihs et al. | 428/336 |
| 2002/0182436 | A1 | 12/2002 | Weihs et al. | |
| 2003/0164289 | A1 * | 9/2003 | Weihs et al. | 204/192.12 |
| 2004/0096350 | A1 * | 5/2004 | Moxson et al. | 419/38 |
| 2005/0003228 | A1 * | 1/2005 | Weihs et al. | 428/635 |
| 2005/0051607 | A1 | 3/2005 | Wang et al. | |
| 2007/0235500 | A1 * | 10/2007 | Suh et al. | 228/101 |
| 2008/0063889 | A1 * | 3/2008 | Duckham et al. | 428/615 |
| 2008/0160183 | A1 * | 7/2008 | Ide et al. | 427/126.5 |
| 2009/0035542 | A1 * | 2/2009 | Weihs et al. | 428/212 |
| 2009/0173626 | A1 * | 7/2009 | Duckham et al. | 204/298.13 |
| 2009/0186195 | A1 * | 7/2009 | Spraker et al. | 428/172 |
| 2010/0175756 | A1 | 7/2010 | Weihs et al. | |
| 2011/0026226 | A1 | 2/2011 | Zheng et al. | |
| 2011/0127314 | A1 * | 6/2011 | Heinrich et al. | 228/123.1 |
| 2011/0186265 | A1 | 8/2011 | Zheng et al. | |
| 2011/0299800 | A1 * | 12/2011 | Seufert et al. | 384/50 |
| 2013/0119322 | A1 * | 5/2013 | Ide et al. | 252/514 |

OTHER PUBLICATIONS

German Patent and Trade Mark Office, Office Action for German Patent Application No. 10 2013 203 232.3, mailed Nov. 28, 2013.

* cited by examiner

*Primary Examiner* — Kiley Stoner
(74) *Attorney, Agent, or Firm* — Ingrassia Fisher & Lorenz, P.C.

(57) ABSTRACT

Methods of bonding components for fabricating electronic assemblies and electronic assemblies including bonded components are provided herein. In one example, a method of bonding components for fabricating an electronic assembly comprises the steps of disposing a first layer of a first high temperature metal-containing paste adjacent to a first component. A second layer of a second high temperature metal-containing paste is disposed adjacent to a second component. A nanostructured multilayer reactive foil is disposed between the first and second layers. The nanostructured multilayer reactive foil is activated to sinter the first and second layers and bond the first and second components.

16 Claims, 2 Drawing Sheets

METHODS OF BONDING COMPONENTS FOR FABRICATING ELECTRONIC ASSEMBLIES AND ELECTRONIC ASSEMBLIES INCLUDING BONDED COMPONENTS

TECHNICAL FIELD

The present invention relates generally to methods for fabricating electronic assemblies and electronic assemblies, and more particularly to methods of bonding components for fabricating electronic assemblies and electronic assemblies fabricated by such methods.

BACKGROUND

Bonding and joining technology is fundamental in the manufacture of a wide variety of electronic assemblies. Power modules are examples of one type of electronic assembly in which forming robust bonds between the various components can be challenging. Power modules typically include electronic components that have high power losses in terms of heat, such as semiconductor dies that include power transistors, diodes, and the like. These modules may be part of a more extensive electronic system responsible for controlling speed and torque of electrical loads like motors.

Typically, power modules include a thermal stack that comprises multiple dies, e.g., semiconductor dies, bonded to a high power substrate, such as a Direct Bonded Copper (DBC) substrate or an Active Metal Brazing (AMB) substrate, which is bonded to a heat sink. The assembly of a substrate(s) with a die(s) and/or a heat sink(s) usually employs conventional bonding and joining technologies such as soldering, brazing, or high pressure sintering. These technologies, however, have several issues. First, soldering, brazing, and high pressure sintering each expose the entire electronic assembly to some form of bulk heating, e.g., reflow ovens for solder, which substantially heats the die(s) to temperatures that can detrimentally affect die performance and reliability. Second, solder joints often rapidly degrade at the relatively high module temperatures achieved during normal operation of power modules. Third, although brazing and high pressure sintering produce bonding joints that are more resilient to relatively high module temperatures, both brazing and high pressure sintering use non-ambient pressure conditions during processing which can be costly. In particular, brazing typically forms bonding joints under a vacuum and high pressure sintering typically forms bonding joints at pressures of about 30 MPa or greater. In addition, the higher pressures used during high pressure sintering can cause the dies to crack, resulting in lower power module production yields.

Accordingly, it is desirable to provide methods of bonding components for fabricating electronic assemblies by forming robust bonding joints, and electronic assemblies fabricated by such methods. Additionally, it is also desirable to provide methods of bonding components for fabricating electronic assemblies that are less costly, production friendly, and/or do not detrimentally affect die performance and reliability, and electronic assemblies fabricated by such methods. Furthermore, other desirable features and characteristics of the present invention will become apparent from the subsequent detailed description and the appended claims, taken in conjunction with the accompanying drawings and this background.

BRIEF SUMMARY

Methods of bonding components for fabricating electronic assemblies and electronic assemblies including bonded components are provided herein. In accordance with an exemplary embodiment, a method of bonding components for fabricating an electronic assembly comprises the steps of disposing a first layer of a first high temperature metal-containing paste adjacent to a first component. A second layer of a second high temperature metal-containing paste is disposed adjacent to a second component. A nanostructured multilayer reactive foil is disposed between the first and second layers. The nanostructured multilayer reactive foil is activated to sinter the first and second layers and bond the first and second components.

In accordance with another exemplary embodiment, a method of bonding components for fabricating an electronic assembly comprises the steps of disposing a first layer of a first high temperature metal-containing paste adjacent to a substrate. A second layer of a second high temperature metal-containing paste is disposed adjacent to a die or a heat sink. A nanostructured multilayer reactive foil is disposed between the first and second layers. The nanostructured multilayer reactive foil is exposed to a stimulus to react the nanostructured multilayer reactive foil and generate heat sufficient to sinter the first and second layers and form a bonding joint that bonds the substrate with the die or the heat sink.

In accordance with another exemplary embodiment, an electronic assembly including bonded components comprises a first component and a second component. The second component is bonded to the first component by a bonding joint. The bonding joint comprises a reacted nanostructured multilayer reactive foil disposed in a matrix of sintered metal.

BRIEF DESCRIPTION OF THE DRAWINGS

The present invention will hereinafter be described in conjunction with the following drawing figures, wherein like numerals denote like elements, and wherein.

DETAILED DESCRIPTION

Figure 1:
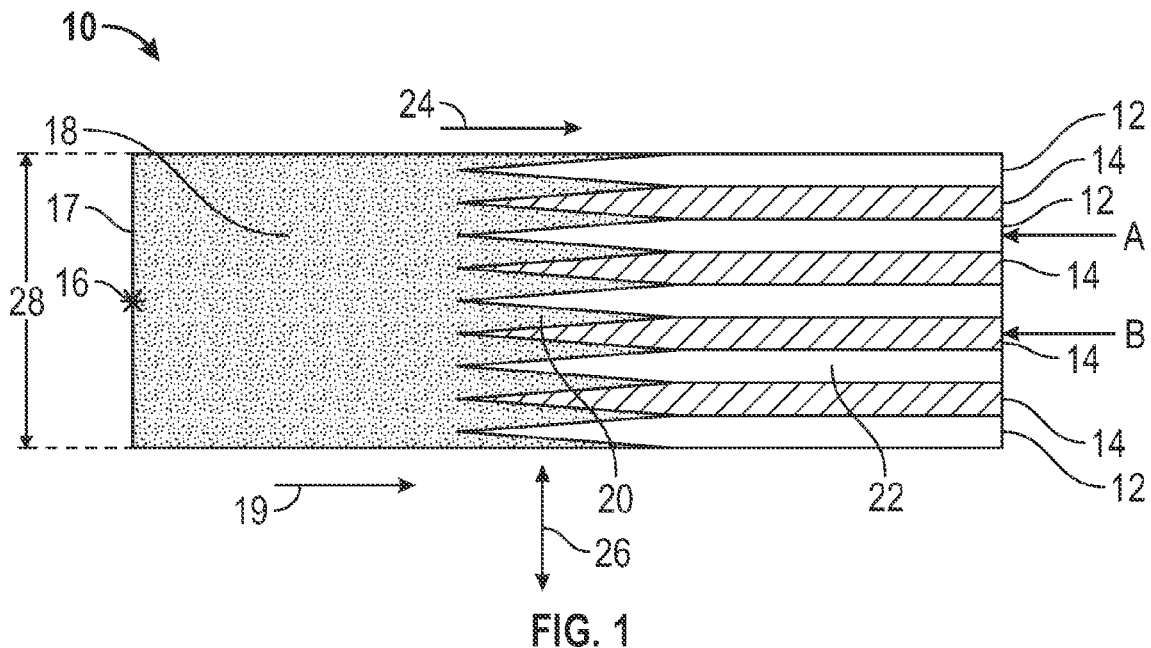
FIG. 1 is a cross-sectional view of a nanostructured multilayer reactive foil during a self-propagating reaction in accordance with an exemplary embodiment.

The following Detailed Description is merely exemplary in nature and is not intended to limit the invention or the application and uses of the invention. Furthermore, there is no intention to be bound by any theory presented in the preceding background or the following detailed description.

Various embodiments contemplated herein relate to methods of bonding components for fabricating electronic assemblies and electronic assemblies fabricated by such methods. The exemplary embodiments described herein arrange a first layer of high temperature metal-containing paste adjacent to a first component, e.g., a substrate. In an exemplary embodiment, the high temperature metal-containing paste comprises micro-sized or nano-sized metal particles in a solvent, and the metal particles have a melting point of about 900° C. or greater. In one example, the high temperature metal-containing paste is silver paste that contains micro-sized and/or nano-sized silver particles in a solvent. A second layer of high temperature metal-containing paste, e.g., silver paste, is arranged adjacent to a second component, e.g., a die or a heat sink.

A nanostructured multilayer reactive foil is arranged between the first and second layers. As will be described in further detail below, the nanostructured multilayer reactive foil comprises a plurality of alternating nanostructured layers of at least two different materials that can react when activated, e.g., ignited, to form a stable product(s) with large negative heats of formation and high reaction temperatures. In an exemplary embodiment, the nanostructured multilayer reactive foil is activated by exposing the foil to a stimulus, such as a pulse of electrical energy, to react the foil, generating localized heat sufficient to sinter the first and second layers of high temperature metal-containing paste and form a bonding joint that bonds the first and second components. As used herein, the terms "sinter," "sintered," and "sintering" refer to a process by which powdered metal, e.g. paste comprising metal particles in a solvent, are fused into a solid piece substantially by atomic diffusion across the boundaries of the metal particles typically at a temperature(s) below the melting point of the particles. In an exemplary embodiment, the bonding joint comprises the reacted nanostructured multilayer reactive foil disposed in a matrix of sintered metal.

By locally heating the first and second layers of high temperature metal-containing paste via the reaction of the nanostructured multilayer reactive foil, the high temperature metal-containing paste is sintered to form a robust bonding joint, which is resilient to the relatively high module temperatures that are typically achieved during normal operation of power modules, without having to expose the entire electronic assembly including the die to bulk heating that could otherwise detrimentally affect die performance and reliability. Moreover, the formation of the bonding joint(s) can occur at ambient pressures to provide a cost efficient and production friendly process.

Referring to FIG. 1, a cross-sectional view of a nanostructured multilayer reactive foil 10 during a self-propagating reaction for use in bonding components for fabricating electronic assemblies in accordance with exemplary embodiments is provided. As illustrated, the nanostructured multilayer reactive foil 10 comprises alternating layers 12 and 14 of materials A and B, respectively. The alternating layers 12 and 14 may be formed of any materials amenable to mixing of neighboring atoms (or having changes in chemical bonding) in response to a stimulus 16, including silicides (e.g., Rh/Si, Ni/Si, and Zr/Si, and the like), aluminides (e.g., Ni/Al, Ti/Al, Monel/Al, and Zr/Al, and the like), borides (e.g. Ti/B), carbides (e.g., Ti/C), thermite reacting compounds (e.g., $Al/Fe_2O_3$ or $Al/Cu_2O$), alloys, metallic glasses, and composites (e.g., metal ceramic).

The materials A and B used in fabrication of the nanostructured multilayer reactive foil 10 are chemically distinct. In an exemplary embodiment, the alternating layers 12 and 14 alternate between a transition metal (e.g., Ti, Ni, and the like) and a light element (e.g., B, Al, and the like). The elements of the materials A and B are chosen based on the way they react to form a stable product(s) with large negative heats of formation and high adiabatic reaction temperatures. In an exemplary embodiment, at least one of the layers 12 or 14 of the nanostructured multilayer reactive foil 10 is (or contains) Al and at least one other of the layers 12 or 14 is (or contains) Ni.

In an exemplary embodiment, when the nanostructured multilayer reactive foil 10 is exposed to the stimulus 16 (e.g., electrical energy such as an electrical pulse from a 9V battery or the like, optical energy, thermal energy, or the like), for example at one end 17, neighboring atoms from the materials A and B mix, e.g., as shown in the reacted section 18. The change in chemical bonding caused by the mixing results in a reduction in atomic bond energy, thus generating heat in an exothermic chemical reaction. This change in chemical bonding occurs as the layers 12 with A-A bonds and the layers 14 with B—B bonds are exchanged for A-B bonds, thereby reducing the chemical energy stored in each layer, and generating heat.

As illustrated, this generated heat diffuses through the nanostructured multilayer reactive foil 10 (in a direction indicated by single headed arrow 19 from the reacted section 18 through the reaction zone 20 to the unreacted section 22) and initiates additional mixing of the unreacted alternating layers 12 and 14. As a result, a self-sustaining/self propagating reaction is produced through the nanostructured multilayer reactive foil 10. With sufficiently large and rapid heat generation, the reaction propagates across the entire nanostructured multilayer reactive foil 10 indicated by single headed arrow 24 at velocities typically of about 1 m/s or greater.

As the reaction does not require additional atoms from the surrounding environment (as, for example, oxygen in the case of combustion), the reaction makes the nanostructured multilayer reactive foil 10 a self-contained source of energy capable of emitting bursts of heat and light rapidly, capable of reaching temperatures of up to about 1000° C. or greater, and a localized heating rate of up to about $10^{9}$° C./s. In particular, the speed at which the reaction can propagate depends on how rapidly the atoms diffuse normal to their layering (indicated by double headed arrow 26) and how rapidly heat is conducted along a length of the nanostructured multilayer reactive foil 10.

The propagation velocity is a strong function of the thicknesses of the individual layers 12 and 14 in the nanostructured multilayer reactive foil 10. As the thickness of individual layers 12 and 14 decreases, the diffusion distances are smaller and atoms can mix more rapidly. In an exemplary embodiment, the thickness of the individual layers 12 and 14 is from about 1 to about 1000 nm. Heat is released at a higher rate, and therefore the reaction travels faster through the nanostructured multilayer reactive foil 10. Additionally, as the overall thickness (indicated by double headed arrow 28) of the nanostructured multilayer reactive foil 10 increases, the quantity of heat generated generally increases. In an exemplary embodiment, the overall thickness of the nanostructured the nanostructured multilayer reactive foil 10 is at least about 100 μm, such as from about 100 to about 5000 μm, for example from about 200 to about 1000 μm.

Accordingly, the nanostructured multilayer reactive foil 10 can be used in accordance with exemplary embodiments described herein as a local heat source for sintering high temperature metal-containing paste to bond components for an electronic assembly without having to expose the electronic assembly including the die to higher temperatures and pressures. Some non-limiting examples of commercially available nanostructured multilayer reactive foils are various foils available under the trade name of NanoFoil®, manufactured by Indium Corporation, which is headquartered in Clinton, N.Y.

Figure 2:
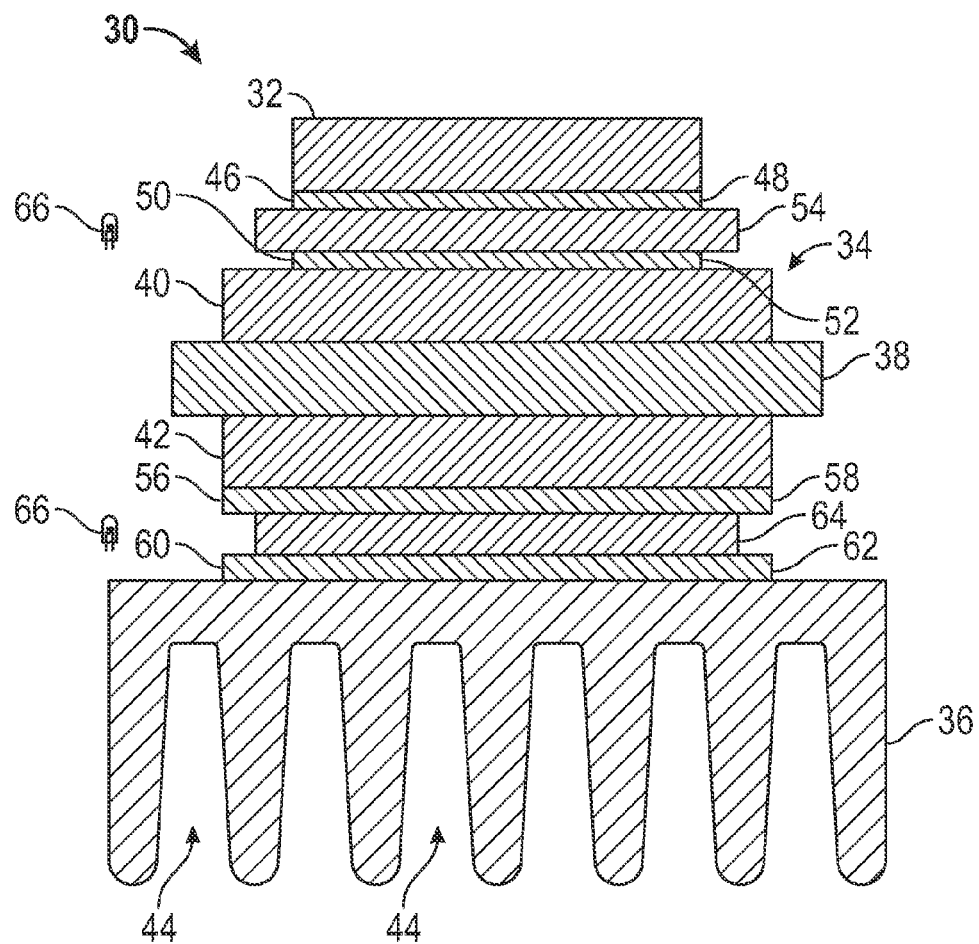
FIG. 2 is a cross-sectional view of an electronic assembly during an intermediate fabrication stage in accordance with an exemplary embodiment.

Referring to FIG. 2, a cross-sectional view of an electronic assembly 30 during an intermediate fabrication stage in accordance with an exemplary embodiment is provided. Various steps in the manufacture of electronic assemblies are well known and so, in the interest of brevity, many conventional steps will only be mentioned briefly herein or will be omitted entirely without providing the well known process details. The electronic assembly 30 comprises a die 32, a substrate 34, and a heat sink 36. Notably, the illustrated portion of the electronic assembly 30 includes only a single die 32, although those skilled in the art will recognize that an actual electronic assembly could include a plurality of dies.

As illustrated, the electronic assembly 30 is configured as a power module prior to the step(s) of bonding the die 32 to the substrate 34 and the substrate 34 to the heat sink 36 to form a thermal stack. The substrate 34 may be a Direct Bonded Copper (DBC) substrate or an Active Metal Brazing (AMB) substrate as are commonly employed for power modules, or alternatively, may be any other suitable substrate known to those skilled in the art. In an exemplary embodiment, the substrate 34 comprises a ceramic layer 38 interposed between an upper copper layer 40 and a lower copper layer 42.

The die 32 may be, for example, a semiconductor die that include power transistors, diodes, and/or the like, or any other electronic circuit device known to those skilled in the art. The heat sink 36 includes multiple channels 44 through which coolant can flow. In particular, when the electronic assembly 30 is operating, the flow of coolant through the channels 44 reduces the temperature of the heat sink 36 and, in turn, reduces the temperature of the substrate 34 and the die 32.

A first layer 46 of high temperature metal-containing paste 48 is disposed adjacent to the die 32 and a second layer 50 of high temperature metal-containing paste 52 is disposed adjacent to the substrate 34. Interposed between the first and second layers 46 and 50 is a first nanostructured multilayer reactive foil 54. Similarly, a third layer 56 of high temperature metal-containing paste 58 is disposed adjacent to the substrate 34 and a fourth layer 60 of high temperature metal-containing paste 62 is disposed adjacent to the heat sink 36. Interposed between the third and fourth layers 56 and 60 is a second nanostructured multilayer reactive foil 64. The first and second nanostructured multilayer reactive foils 54 and 64 are configured and effectively function as described above in relation to the nanostructured multilayer reactive foil 10 illustrated in FIG. 1.

The high temperature metal-containing paste 48, 52, 58, and 62 can be separate quantities of the same high temperature metal-containing paste or different high temperature metal-containing pastes. In an exemplary embodiment, the high temperature metal-containing paste 48, 52, 58, and 62 comprises micro-sized and/or nano-sized metal particles of (or containing) silver, aluminum, nickel, or combinations thereof in a solvent. In one example, the high temperature metal-containing paste is silver paste that contains micro-sized and/or nano-sized silver particles in a solvent. In another example, the metal particles have an average particle size of about 50 μm or less, for example of from about 0.01 to about 50 μm. In an exemplary embodiment, the metal particles have a melting point of about 900° C. or greater, for example of from about 950 to about 1100° C., e.g., silver has a melting point of about 962° C. In an exemplary embodiment, the first, second, third, and fourth layers 46, 50, 56, and 60 each have a thickness of at least about 100 μm, for example of from about 100 to about 500 μm.

In an exemplary embodiment, once the components of the electronic assembly 30, e.g., die 32, substrate 34, and heat sink 36, are assembled as illustrated with the layers 46, 50, 56, and 60 of high temperature metal-containing paste 48, 52, 58, and 62 and the nanostructured multilayer reactive foils 54 and 64, a stimulus 66 is applied to each of the nanostructured multilayer reactive foils 54 and 64 as discussed above to produce rapid and intense heat diffusion as a thermal wavefront through the foils 54 and 64. As such, the heat rapidly conducts into the adjacent layers 46, 50, 56, and 60 to provide localized heating of the layers 46, 50, 56, and 60. In an exemplary embodiment, the nanostructured multilayer reactive foils 54 and 64 each generate a localized temperature of at least about 750° C., for example of from about 800 to about 960° C., within a time period of about 10 ms or less, such as of about 5 ms or less, for example from about 0.01 to about 5 ms, from activation via the stimulus 66. In another embodiment, the nanostructured multilayer reactive foils 54 and 64 each generate a localized temperature less than about a melting temperature of the metal particles contained in the high temperature metal-containing paste 48, 52, 58, and 62.

Figure 3:
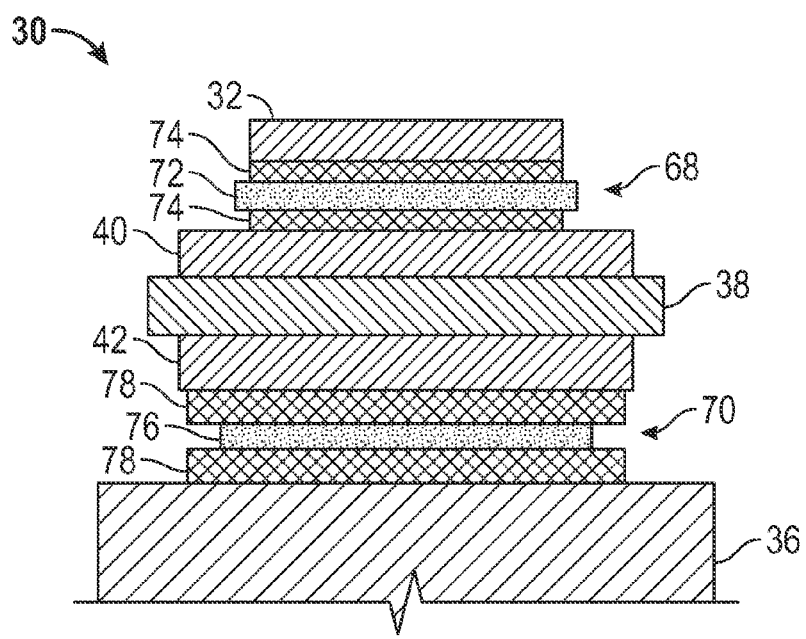
FIG. 3 is a partial cross-sectional view of an electronic assembly during a later fabrication stage in accordance with an exemplary embodiment.

Referring also to FIG. 3, in an exemplary embodiment, the heat generated by the first and second nanostructured multilayer reactive foils 54 and 64 is sufficient to sinter the layers 46, 50, 56, and 60 of high temperature metal-containing paste 48, 52, 58, and 62, e.g., solvent vaporizes and/or decomposes and the metal particles fuse together via primarily atomic diffusion, and form first and second bonding joints 68 and 70. The first bonding joint 68 bonds the die 32 and the substrate 34, and comprises the reacted first nanostructured multilayer reactive foil 72 disposed in a first matrix of sintered metal 74 that is formed from sintering the first and second layers 46 and 50. The second bonding joint 70 bonds the substrate 34 and the heat sink 36, and comprises the reacted second nanostructured multilayer reactive foil 76 and a second matrix of sintered metal 78 that is formed from sintering the third and fourth layers 56 and 60. Although the reacted first and second nanostructured multilayer reactive foils 72 and 76 are each illustrated as being discrete layers, it is to be understood that the reacted first and second nanostructured multilayer reactive foils 72 and 76 may be partially or substantially diffused into the first and second matrixes of sintered metal 74 and 78, respectively. In an exemplary embodiment, the reacted first and second nanostructured multilayer reactive foils 72 and 76 comprise nickel and aluminum, and the first and second matrices of sintered metal 74 and 78 comprise silver. This new reactive joining process eliminates the need for furnaces and/or pressure chambers or other external heat and/or pressure sources, and with very localized heating, temperature and pressure sensitive components or materials can be joined without thermal or pressure induced damage.

Figure 4:
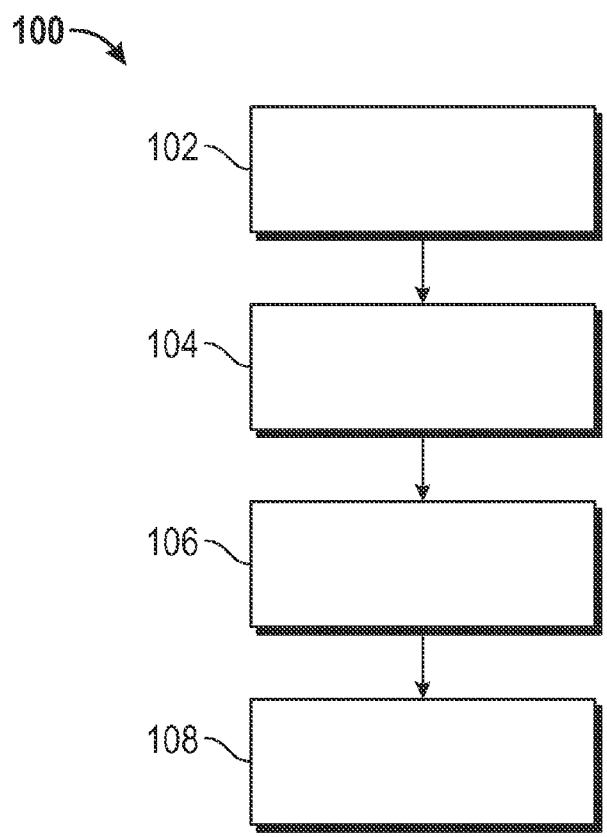
FIG. 4 is a flowchart of a method of bonding components for fabricating and electronic assembly in accordance with an exemplary embodiment.

Referring to FIG. 4, a flowchart of a method of bonding components for fabricating and electronic assembly in accordance with an exemplary embodiment is provided. The method 100 comprises disposing a first layer of high temperature metal-containing paste (step 102) adjacent to a first component. A second layer of high temperature metal-containing paste (step 104) is disposed adjacent to a second component. A nanostructured multilayer reactive foil is disposed (step 106) between the first and second layers. The nanostructured multilayer reactive foil is activated (step 108) by exposing the nanostructured multilayer reactive foil to a stimulus. In response to the stimulus, the nanostructured multilayer reactive foil reacts to generate heat sufficient to sinter the first and second layers and form a bonding joint that bonds the first and second components.

Accordingly, methods of bonding components for fabricating electronic assemblies and electronic assemblies fabricated by such methods have been described. Unlike the prior art, the exemplary embodiment taught herein form a bonding joint that bonds two component of an electronic assembly by reacting a nanostructured multilayer reactive foil that is disposed between two layers of high temperature metal-containing paste. In an exemplary embodiment, the bonding joint comprises the reacted nanostructured multilayer reactive foil disposed in a matrix of sintered metal that is formed from sintering the two layers of high temperature metal-containing paste.

While at least one exemplary embodiment has been presented in the foregoing detailed description of the disclosure, it should be appreciated that a vast number of variations exist. It should also be appreciated that the exemplary embodiment or exemplary embodiments are only examples, and are not intended to limit the scope, applicability, or configuration of the disclosure in any way. Rather, the foregoing detailed description will provide those skilled in the art with a convenient road map for implementing an exemplary embodiment of the disclosure. It being understood that various changes may be made in the function and arrangement of elements described in an exemplary embodiment without departing from the scope of the disclosure as set forth in the appended claims.

What is claimed is:

1. A method of bonding components for fabricating an electronic assembly, the method comprising the steps of:
   disposing a first layer of a first metal-containing paste adjacent to a first component;
   disposing a second layer of a second metal-containing paste adjacent to a second component;
   disposing a nanostructured multilayer reactive foil between the first and second layers; and
   activating the nanostructured multilayer reactive foil to sinter the first and second layers and bond the first and second components, wherein activating comprises reacting the nanostructured multilayer reactive foil to generate a temperature of at least about 750° C. along the nanostructured multilayer reactive foil.

2. The method of claim 1, wherein the step of disposing the first layer comprises forming the first layer with the first metal-containing paste that comprises silver, aluminum, nickel, or combinations thereof, and/or the step of disposing the second layer comprises forming the second layer with the second metal-containing paste that comprises silver, aluminum, nickel, or combinations thereof.

3. The method of claim 1, wherein the step of disposing the first layer comprises forming the first layer with the first metal-containing paste that comprises silver paste, and/or the step of disposing the second layer comprises forming the second layer with the second metal-containing paste that comprises the silver paste.

4. The method of claim 1, wherein the step of disposing the first layer comprises forming the first layer with the first metal-containing paste that comprises first metal particles having a first average particle size of about 50 μm or less, and/or the step of disposing the second layer comprises forming the second layer with the second metal-containing paste that comprises second metal particles having a second average particle size of about 50 μm or less.

5. The method of claim 1, wherein the step of disposing the first layer comprises forming the first layer having a first thickness of at least about 100 μm, and/or the step of disposing the second layer comprises forming the second layer having a second thickness of at least about 100 μm.

6. The method of claim 1, wherein the step of disposing the first layer comprises disposing the first layer adjacent to the first component that is a substrate.

7. The method of claim 6, wherein the step of disposing the second layer comprises disposing the second layer adjacent to the second component that is a die.

8. The method of claim 6, wherein the step of disposing the second layer comprises disposing the second layer adjacent to the second component that is a heat sink.

9. The method of claim 1, wherein the step of disposing the nanostructured multilayer reactive foil comprises disposing the nanostructured multilayer reactive foil that has a thickness of at least about 100 μm.

10. The method of claim 1, wherein the step of disposing the nanostructured multilayer reactive foil comprises disposing the nanostructured multilayer reactive foil that comprises alternating nanostructured layers of aluminum and nickel.

11. The method of claim 1, wherein the step of activating comprises reacting the nanostructured multilayer reactive foil to generate the temperature of from about 800 to about 960° C. along the nanostructured multilayer reactive foil.

12. The method of claim 1, wherein the step of activating comprises reacting the nanostructured multilayer reactive foil to generate the temperature within a time period of about 10 ms or less from activation.

13. A method of bonding components for fabricating an electronic assembly, the method comprising the steps of:
   disposing a first layer of a first metal-containing paste adjacent to a first component;
   disposing a second layer of a second metal-containing paste adjacent to a second component;
   disposing a nanostructured multilayer reactive foil between the first and second layers; and
   activating the nanostructured multilayer reactive foil to sinter the first and second layers and bond the first and second components, wherein activating comprises reacting the nanostructured multilayer reactive foil to generate a temperature that along the nanostructured multilayer reactive foil is less than about a first melting temperature and a second melting temperature of the first and second metal-containing pastes, respectively.

14. The method of claim 1, wherein the step of activating comprises exposing the first and second components to about ambient pressure during sintering of the first and second layers.

15. A method of bonding components for fabricating an electronic assembly, the method comprising the steps of:
   disposing a first layer of a first metal-containing paste adjacent to a substrate;
   disposing a second layer of a second metal-containing paste adjacent to a die or a heat sink;
   disposing a nanostructured multilayer reactive foil between the first and second layers; and
   exposing the nanostructured multilayer reactive foil to a stimulus to react the nanostructured multilayer reactive foil and generate heat sufficient to sinter the first and second layers and form a bonding joint that bonds the substrate with the die or the heat sink, wherein the first and second metal-containing pastes are a first quantity and a second quantity of silver paste, respectively, and wherein exposing comprises reacting the nanostructured multilayer reactive foil to generate a temperature of from about 800 to about 960° C. along the nanostructured multilayer reactive foil to sinter the silver paste.

16. The method of claim 15, wherein the step of exposing comprises exposing the nanostructured multilayer reactive foil to the stimulus that comprises electrical energy, optical energy, or thermal energy.

* * * * *